(12) United States Patent
Luo

(10) Patent No.: US 11,145,818 B2
(45) Date of Patent: Oct. 12, 2021

(54) ELECTROLUMINESCENT MATERIAL, METHOD FOR MANUFACTURING THE SAME, AND LUMINESCENT DEVICE

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 330 days.

(21) Appl. No.: 16/332,364

(22) PCT Filed: Jan. 2, 2019

(86) PCT No.: PCT/CN2019/070050
§ 371 (c)(1),
(2) Date: Mar. 12, 2019

(87) PCT Pub. No.: WO2020/077884
PCT Pub. Date: Apr. 23, 2020

(65) Prior Publication Data
US 2020/0136051 A1 Apr. 30, 2020

(30) Foreign Application Priority Data
Oct. 19, 2018 (CN) .......................... 201811220267.6

(51) Int. Cl.
*H01L 51/00* (2006.01)
*H05B 33/10* (2006.01)
*H01L 51/50* (2006.01)
*H01L 51/56* (2006.01)

(52) U.S. Cl.
CPC ......... *H01L 51/0058* (2013.01); *H05B 33/10* (2013.01); *H01L 51/5012* (2013.01); *H01L 51/56* (2013.01)

(58) Field of Classification Search
None
See application file for complete search history.

(56) References Cited

FOREIGN PATENT DOCUMENTS

CN 1730507 A * 2/2006

OTHER PUBLICATIONS

Machine English translation of Huang (CN 1730507 A). Jun. 24, 2021.*

* cited by examiner

Primary Examiner — Jay Yang

(57) ABSTRACT

A luminescent material, a method for manufacturing the luminescent material and a luminescent device are provided. The method includes reacting 2,7-dibromofluorene and bromine hexyl to generate a first intermediate product, reacting the first intermediate product and a bis(pinacolato)diboron reagent to generate a second intermediate product, reacting 1, 4-dibromo-phenodiphene and the organic thermal activation delayed fluorescent material to generate a third intermediate product, and reacting the first intermediate product, the second intermediate product and the third intermediate product to generate the electroluminescent material.

20 Claims, 2 Drawing Sheets

ELECTROLUMINESCENT MATERIAL, METHOD FOR MANUFACTURING THE SAME, AND LUMINESCENT DEVICE

RELATED APPLICATIONS

This application is a National Phase of PCT Patent Application No. PCT/CN2019/070050 having International filing date of Jan. 2, 2019, which claims the benefit of priority of Chinese Patent Application No. 201811220267.6 filed on Oct. 19, 2018. The contents of the above applications are all incorporated by reference as if fully set forth herein in their entirety.

FIELD AND BACKGROUND OF THE INVENTION

The present invention relates to a lighting field, and particularly to an electroluminescent material, a method for manufacturing the electroluminescent material, and a luminescent device.

In prior art, in the organic light emitting diode (OLED) lighting panel, red, green and blue light emitted from red, green and blue fluorescent material are cooperated to white light, or yellow and blue light emitted from yellow and blue fluorescent material are cooperated to white light, but a quantum efficiency of the present fluorescent material can only reach to 25%. Therefore, it is necessary to provide a high quantum efficiency of a white light electroluminescent material and device.

SUMMARY OF THE INVENTION

An electroluminescent material and a method for manufacturing the electroluminescent material, and a luminescent device are provided to realize a high quantum efficiency of a white light electroluminescent material and device.

An electroluminescent material, wherein a molecular structural formula of the electroluminescent material is as follows:

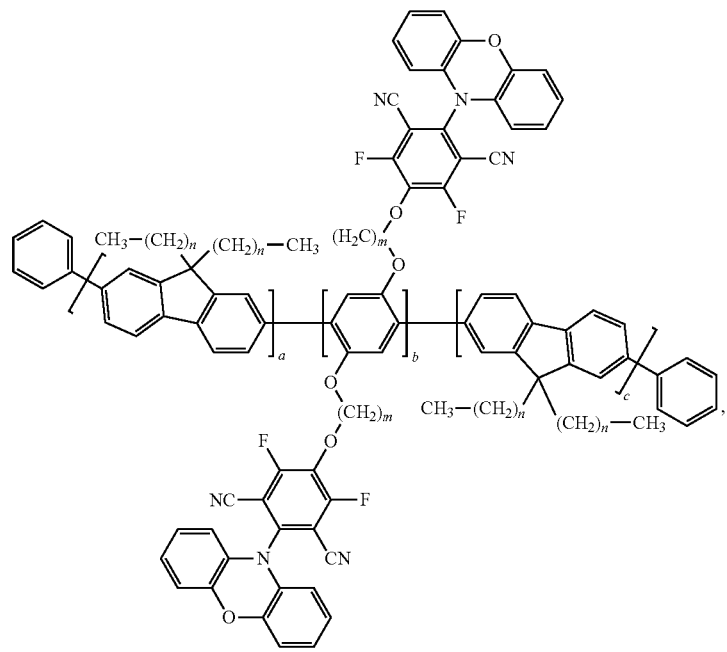

m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

A method for manufacturing an electroluminescent material includes:

providing a first reactant and a second reactant and reacting the first reactant and the second reactant to generate a first intermediate product, wherein a molecular structural formula of the first reactant is

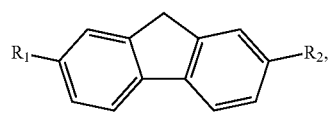

a molecular structural formula of the second reactant is $CH_3-(CH_2)_n-R_3$, a molecular structural formula of the first intermediate product is

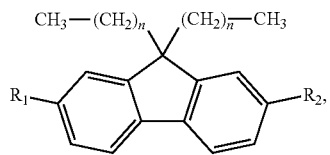

wherein n is a number greater than or equal to 3, $R_1$ is Cl, Br, or I, $R_2$ is Cl, Br, or I, and $R_3$ is Cl, Br, or I;

providing a third reactant and reacting the first intermediate product and the third reactant to generate a second intermediate product, wherein the third reactant is a bis(pinacolato)diboron reagent, a molecular structural formula of the third reactant is

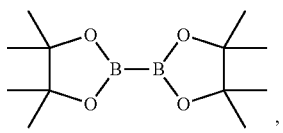

a molecular structural formula of the second intermediate product is

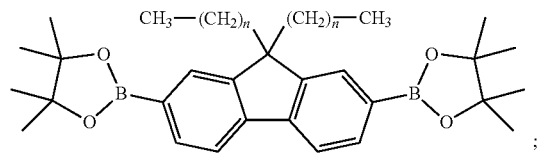

providing a fourth reactant and a fifth reactant and reacting the fourth reactant and the fifth reactant to generate a third intermediate product, wherein a molecular structural formula of the fourth reactant is

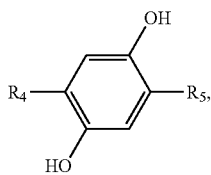

a molecular structural formula of the fifth reactant is

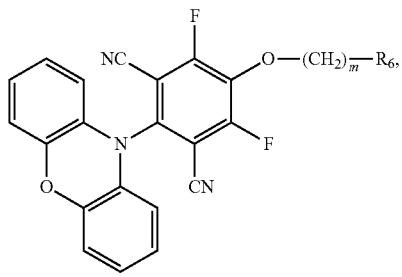

a molecular structural formula of the third intermediate product is

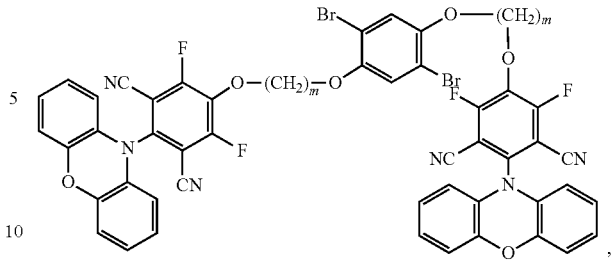

wherein m is a number greater than or equal to 4, $R_4$ is Cl, Br, or I, $R_5$ is Cl, Br, or I, and $R_6$ is Cl, Br, or I;

reacting the first intermediate product, the second intermediate product and the third intermediate product to generate the electroluminescent material.

The method for manufacturing the electroluminescent material of the present disclosure, in the reacting process of reacting the first reactant and the second reactant to generate the first intermediate product, a relationship between a molar weight of the first reactant and a volume of the second reactant is that for 1 millimoles of the first reactant, there are 0.5 milliliters-2 milliliters of the second reactant.

The method for manufacturing the electroluminescent material of the present disclosure, the first reactant and the second reactant are reacted in a first solvent to generate the first intermediate product, and the first solvent is selected from a group consisting of styrene, perchloroethylene, trichloroethylene, acetone, ethylene glycol ether, and triethanolamine.

The method for manufacturing the electroluminescent material of the present disclosure, the first solvent comprises a first additive, and the first additive is selected from a group consisting of potassium hydroxide, sodium hydroxide, sodium tertiary butanol ($NaO_t$-Bu), and sodium bicarbonate.

The method for manufacturing the electroluminescent material of the present disclosure, in the reacting process of reacting the first intermediate product and the third reactant to generate the second intermediate product, a relationship between a molar weight of the first intermediate product and a molar weight of the third reactant is that for 1 millimoles of the first intermediate product, there are 1 millimoles-5 millimoles of the third reactant.

The method for manufacturing the electroluminescent material of the present disclosure, the first intermediate product and the third reactant are reacted in a second solvent to generate the second intermediate product, and the second solvent is selected from a group consisting of styrene, perchloroethylene, trichloroethylene, acetone, sodium tert-butanol ($NaO_t$-Bu), N, n-dimethylformamide, and triethanolamine.

The method for manufacturing the electroluminescent material of the present disclosure, the second solvent comprises a second additive, and the second additive is selected from a group consisting of [1,1'-bis (diphenyl phosphine) diferrocene] palladium dichloride ($Pd(dppf)Cl_2$), potassium acetate (KOAc), sodium acetate (NaOAc), sodium tert-butanol ($NaO_t$-Bu), potassium nitrate ($KNO_3$), and magnesium sulfate ($MgSO_4$).

The method for manufacturing the electroluminescent material of the present disclosure, in the reacting process of reacting the fourth reactant and the fifth reactant to generate the third intermediate product, a relationship between a molar weight of the fourth reactant and a molar weight of the fifth reactant is that for 1 millimoles of the fourth reactant, there are 1 millimoles-10 millimoles of the fifth reactant.

The method for manufacturing the electroluminescent material of the present disclosure, the fourth reactant and the fifth reactant are reacted in a third solvent to generate the third intermediate product, and the third solvent is selected from a group consisting of styrene, perchloroethylene, trichloroethylene, acetone, ethylene glycol ether, and triethanolamine.

from a group consisting of [1,1'-bis (diphenyl phosphine) diferrocene] palladium dichloride (Pd(dppf)Cl$_2$), potassium acetate (KOAc), sodium tert-butyl alcohol (NaO$_t$-Bu), sodium acetate (NaOAc), palladium acetate (Pd(C$_2$H$_3$O$_2$)$_2$), and tri-butyl phosphtetrafluoroborate.

The method for manufacturing the electroluminescent material of the present disclosure, wherein a molecular structural formula of the electroluminescent material is as follows:

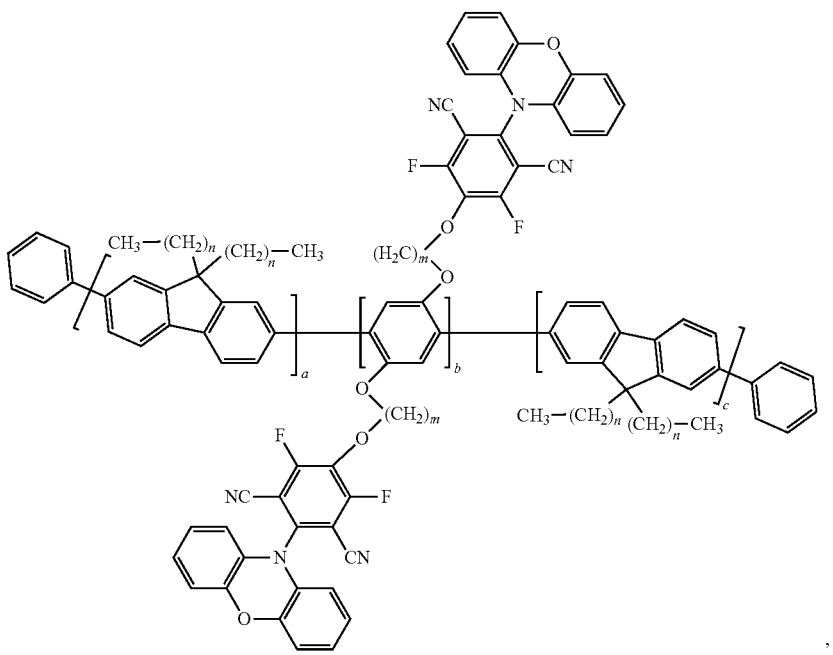

,

The method for manufacturing the electroluminescent material of the present disclosure, the third solvent comprises a third additive, and the third additive is selected from a group consisting of potassium hydroxide, sodium hydroxide, sodium tertiary butanol (NaO$_t$-Bu) and sodium bicarbonate.

The method for manufacturing the electroluminescent material of the present disclosure, in the reacting process of reacting the first intermediate product, the second intermediate product and the third intermediate product to generate the electroluminescent material, a relationship among a molar weight of the first intermediate product, a molar weight of the second intermediate product and a molar weight of the third intermediate product is that for 1 millimoles of the first intermediate product, there are 0.5 millimoles-1.5 millimoles of the second intermediate product and 0.1 millimoles-1.5 millimoles of the third intermediate product.

The method for manufacturing the electroluminescent material of the present disclosure, the first intermediate product, the second intermediate product and the third intermediate product are reacted in a fourth solvent to generate the electroluminescent material, and the fourth solvent is selected from a group consisting of styrene, trichloroethylene, toluene, N, n-dimethylformamide acetone, ethylene glycol ether, and triethanolamine.

The method for manufacturing the electroluminescent material of the present disclosure, the fourth solvent comprises a fourth additive, and the fourth additive is selected m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

The method for manufacturing the electroluminescent material of the present disclosure, wherein the reacting process of reacting the first intermediate product, the second intermediate product and the third intermediate product to generate the electroluminescent material includes:

reacting the first intermediate product, the second intermediate product and the third intermediate product to produce a mixture containing the electroluminescent material;

separating and purifying the mixture containing the electroluminescent material to obtain the electroluminescent material.

The method for manufacturing the electroluminescent material of the present disclosure, wherein the reacting process of separating and purifying the mixture containing the electroluminescent material to obtain the electroluminescent material includes:

extracting the mixture containing the electroluminescent material by an extraction solvent; and employing column chromatography to the mixture containing the electroluminescent material by a chromatographic column.

The method for manufacturing the electroluminescent material of the present disclosure, the extraction solvent is selected from a group consisting of dichloromethane, trichloromethane, and tetrahydrofuran.

The method for manufacturing the electroluminescent material of the present disclosure, a volume ratio of dichloromethane and n-hexane of the chromatographic column ranges from 1:0.5 to 1:10.

A luminescent device, wherein includes:

a base layer, the base layer comprises a substrate base and a first electrode layer formed on the substrate base;

a cavity transmitting and injecting layer, the cavity transmitting and injecting layer is formed on the base layer, and electrically connected to the first electrode layer;

a luminescent layer, the luminescent layer is formed on the cavity transmitting and injecting layer;

an electronic transmitting layer, the electronic transmitting layer is formed on the luminescent layer; and a second electrode layer, the second electrode layer is electrically connected to the electronic transmitting layer, wherein the luminescent layer comprises an electroluminescent material, a molecular structural formula of the electroluminescent material is as follows:

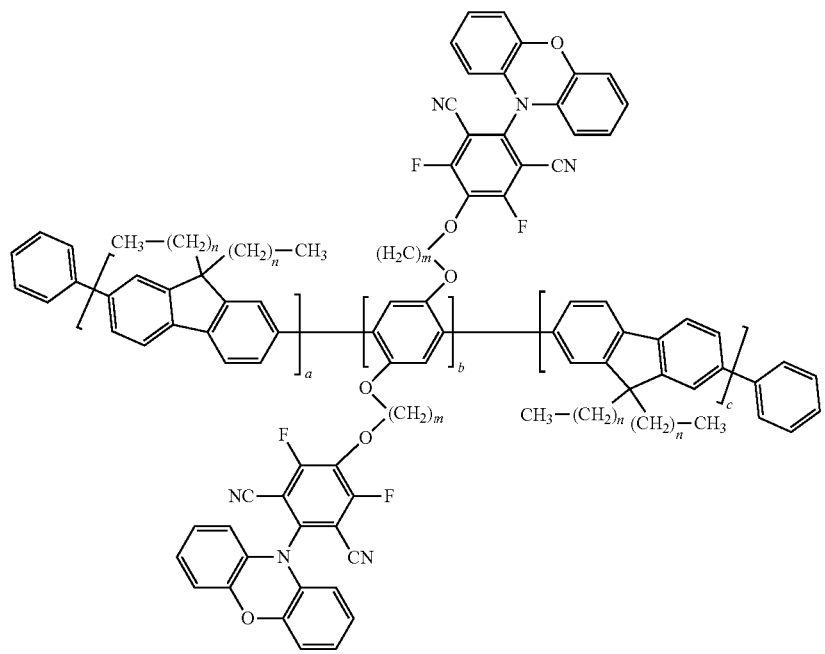

wherein m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

The benefit of the present application is: an electroluminescent material and a method for manufacturing the electroluminescent material, and a luminescent device are provided and includes: reacting the first reactant

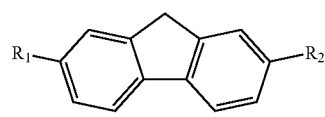

and the second reactant $CH_3-(CH_2)_n-R_3$ to generate the intermediate product

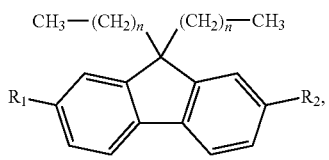

reacting the first intermediate product and the third reactant

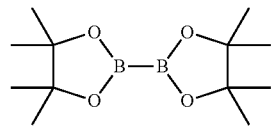

to generate the second intermediate product

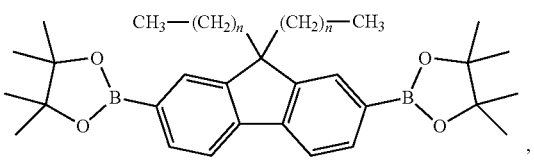

reacting the fourth reactant

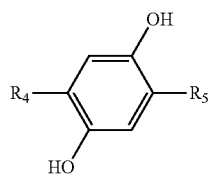

and the fifth reactant

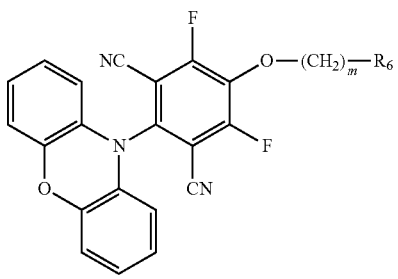

to generate the third intermediate product

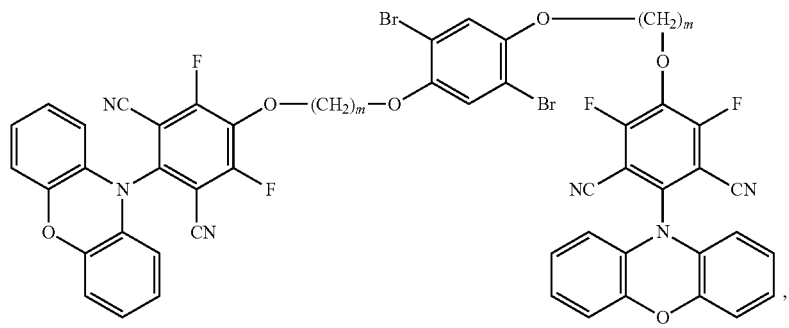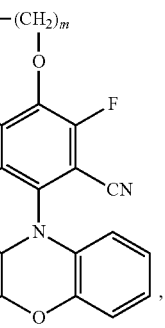

and reacting the first intermediate product, the second intermediate product and the third intermediate product to generate the electroluminescent material

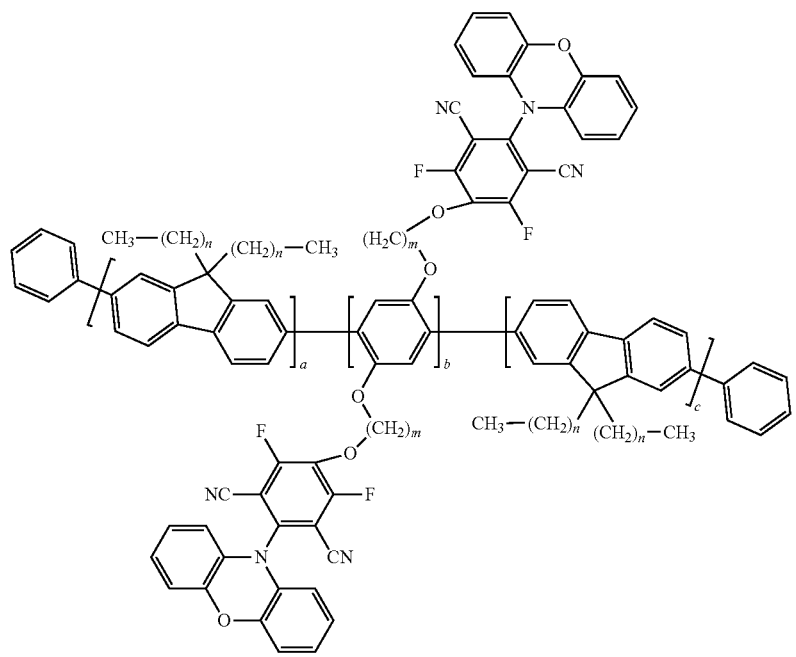

to realize a high quantum efficiency of a white light electroluminescent material and device.

BRIEF DESCRIPTION OF THE SEVERAL VIEWS OF THE DRAWINGS

In order to explain more clearly the embodiments in the present application or the technical solutions in prior art, the following will briefly introduce the figures needed in the description of the embodiments or prior art. Obviously, figures in the following description are only some embodiments recorded in the present application, and for persons skilled in the art, other figures may also be obtained based on these figures without paying creative efforts.

DESCRIPTION OF SPECIFIC EMBODIMENTS OF THE INVENTION

Figure 1:
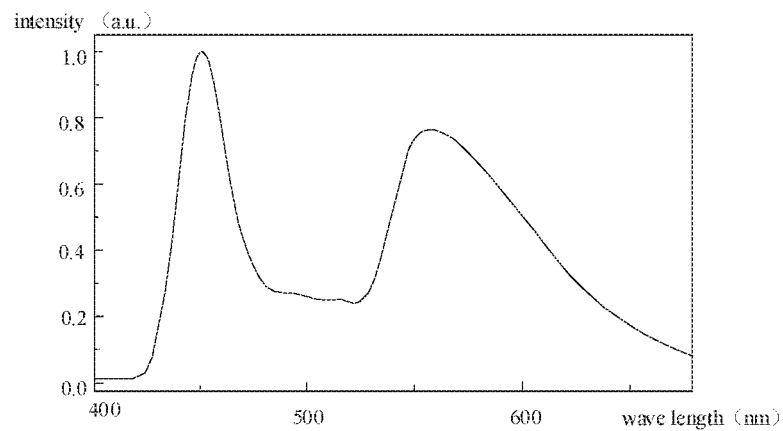
FIG. 1 is a photoluminescence spectrum of an electroluminescent material been in toluene of one exemplary embodiment of the present application.

In order to enable the persons skilled in the art to better understand the technical solutions in this application, clear and comprehensive description will be made to the technical solutions in the embodiments of the present application will be made in the following in combination with the figures in the embodiments of the present application. Obviously, the embodiments described herein are only part of, rather than all of, the embodiments of the present application. Based on the embodiments of the present application, all other embodiments obtained by ordinary skilled persons in the field without paying creative efforts should pertain to the extent of protection of the present application.

An electroluminescent material is provided. A molecular structural formula of the electroluminescent material is as follows:

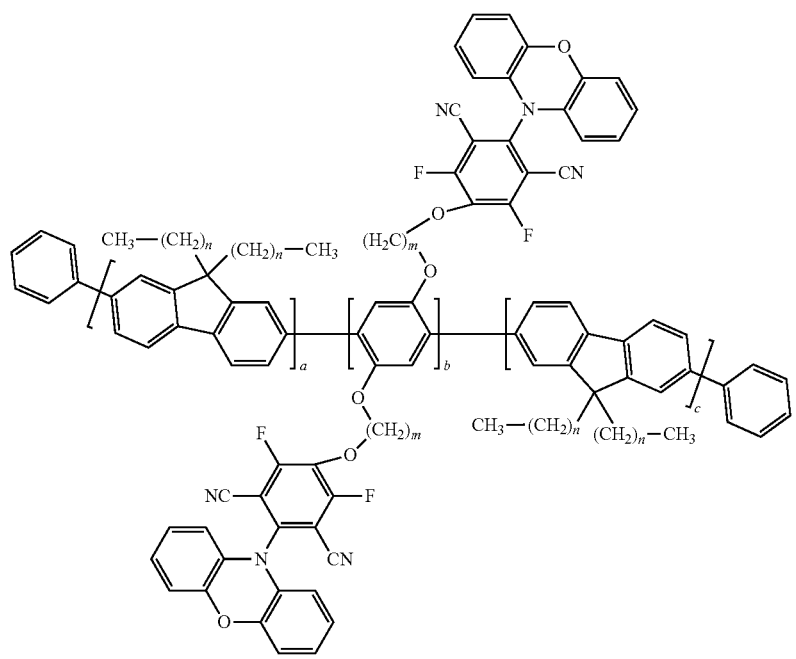

wherein, m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

A method for manufacturing an electroluminescent material is provided. The method includes:

A. a first reactant and a second reactant are provided. The first reactant and the second reactant are reacted to generate a first intermediate product. A molecular structural formula of the first reactant is

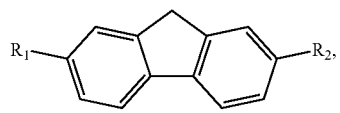

a molecular structural formula of the second reactant is $CH_3$—$(CH_2)_n$—$R_3$, a molecular structural formula of the first intermediate product is

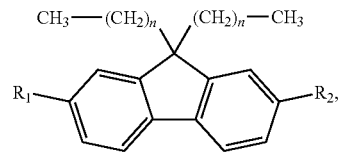

wherein, n is a number greater than or equal to 3, $R_1$ is Cl, Br, or I, $R_2$ is Cl, Br, or I, and $R_3$ is Cl, Br, or I.

A reaction formula of reacting the first reactant and the second reactant to generate the first intermediate product is:

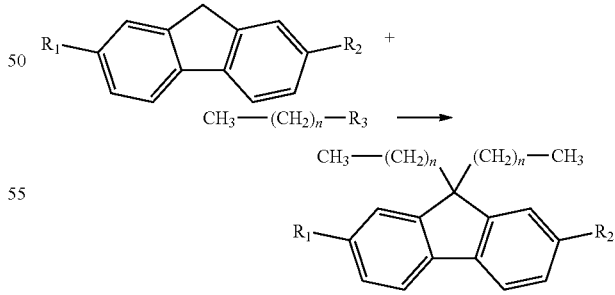

In one embodiment, in the reacting process of reacting the first reactant and the second reactant to generate the first intermediate product, a relationship between a molar weight of the first reactant and a volume of the second reactant is that for 1 millimoles of the first reactant, there are 0.5 milliliters-2 milliliters of the second reactant. In other embodiment, the relationship between the first reactant and the second reactant can be 5 millimoles of the first reactant: 10 milliliters of the second reactant, 6 moles of the first reactant:9 liters of the second reactant, or 15 moles of the first reactant:15 liters of the second reactant, etc.

In one embodiment, the first reactant and the second reactant are reacted in a first solvent to generate the first intermediate product. The first solvent is selected from a group consisting of styrene, perchloroethylene, trichloroethylene, acetone, ethylene glycol ether, and triethanolamine. The first solvent includes a first additive. The first additive is selected from a group consisting of potassium hydroxide, sodium hydroxide, sodium tertiary butanol (NaO$_t$-Bu), and sodium bicarbonate.

In one embodiment, 15 milliliters of the 2,7-dibromoindole

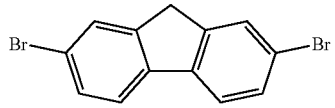

are added to a 200 milliliters two-necked flask, 80 milliliters of the acetone and 10 milliliters of the bromohexyl

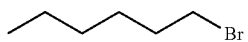

are added, and then the abovementioned are reacted at room temperature for 24 hours, separated and purified to obtain the first intermediate product

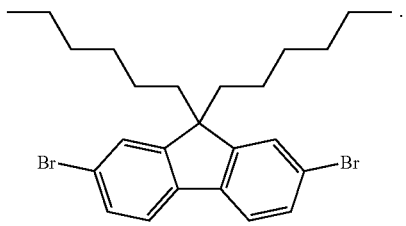 [SMILES: CCCCCCC1(CCCCCC)c2cc(Br)ccc2-c2ccc(Br)cc21]

B. a third reactant is provided, and the first intermediate product and the third reactant are reacted to generate a second intermediate product, the third reactant is a bis (pinacolato)diboron reagent, a molecular structural formula of the third reactant is

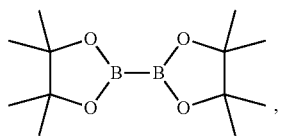

and a molecular structural formula of the second intermediate product is

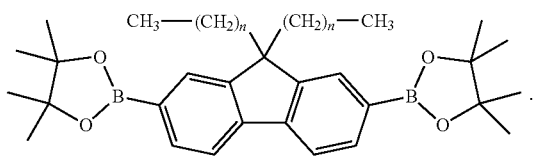

A reaction formula of reacting the first intermediate product and the third reactant to generate the second intermediate product is:

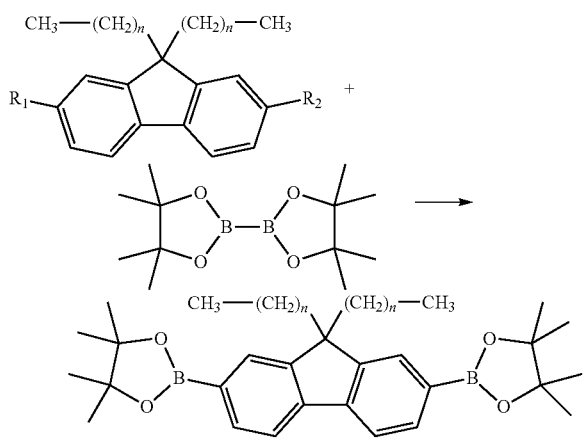

In one embodiment, in the reacting process of reacting the first intermediate and the third reactant to generate the second intermediate product, a relationship between a molar weight of the first intermediate product and a molar weight of the third reactant is that for 1 millimoles of the first intermediate product, there are 1 millimoles-5 millimoles of the third reactant. In other embodiment, a relationship between the first intermediate and the third reactant is 5 millimoles of the first intermediate:5 millimoles of the third reactant, 8 moles of the first intermediate:10 liters of the third reactant, or 18 moles of the first intermediate:18 liters of the third reactant, etc.

In one embodiment, the first intermediate product and the third reactant are reacted in a second solvent to generate the second intermediate product. The second solvent is selected from a group consisting of styrene, perchloroethylene, trichloroethylene, acetone, sodium tert-butanol (NaO$_t$-Bu), N, N-dimethylformamide, and triethanolamine. The second solvent includes a second additive, and the second additive is selected from a group consisting of [1,1'-bis (diphenyl phosphine) diferrocene] palladium dichloride (Pd(dppf)Cl$_2$), potassium acetate (KOAc), sodium acetate (NaOAc), sodium tert-butanol (NaO$_t$-Bu), potassium nitrate (KNO$_3$), and magnesium sulfate (MgSO$_4$).

In one embodiment, 8 millimoles of the first intermediate

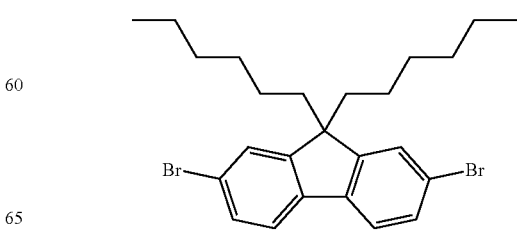

is added to a 100 milliliters two-necked flask, 12 millimoles of the third reactant

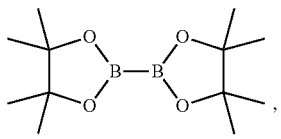

0.8 millimoles of the [1,1'-bi (diphenylphosphonyl) ferrocene]palladium dichloride, and 12 millimoles of the potassium acetate are added and forms a vacuum pumping, 40 mL of acetone is added in an argon atmosphere, the abovementioned are reacted at 100 degrees centigrade for 24 hours, separates and purified to obtain the second intermediate

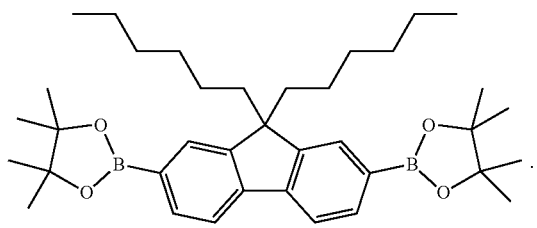

C. a fourth reactant and a fifth reactant are provided, the fourth reactant and the fifth reactant are reacted to generate a third intermediate product, wherein, a molecular structural formula of the fourth reactant is

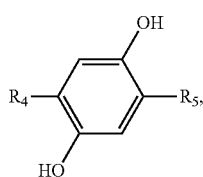

a molecular structural formula of the fifth reactant is

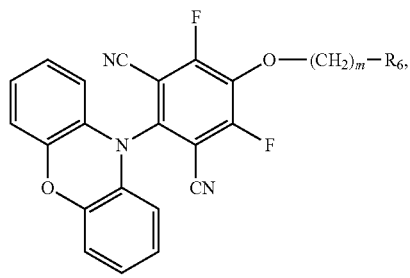

a molecular structural formula of the third intermediate product is

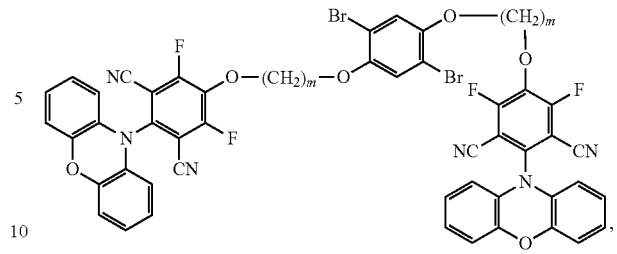

wherein, m is a number greater than or equal to 4, $R_4$ is Cl, Br, or I, $R_5$ is Cl, Br, or I, and $R_6$ is Cl, Br, or I.

A reaction formula of reacting the first intermediate product, the second intermediate product and the third intermediate product to generate the electroluminescent material is:

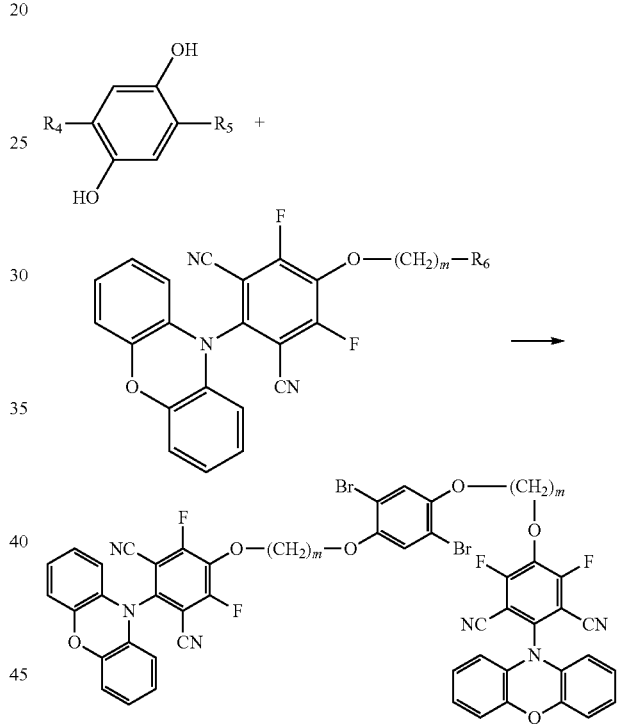

In one embodiment, in the reacting process of reacting the fourth reactant and the fifth reactant to generate the third intermediate product, the relationship between a molar weight of the fourth reactant and a molar weight of the fifth reactant is that for 1 millimoles of the fourth reactant, there are 1 millimoles-10 millimoles of the fifth reactant. In other embodiment, the relationship between of the fourth reactant to the fifth reactant can be 12 millimoles of the fourth reactant to 15 millimoles of the fifth reactant, 8 millimoles of the fourth reactant to 8 millimoles of the fifth reactant, or 5 moles of the fourth reactant to 10 moles of the fifth reactant. The fifth reactant is made of an organic thermal activation delayed fluorescent material.

In one embodiment, the fourth reactant and the fifth reactant are reacted in a fourth solvent to generate the third intermediate product, and the third solvent is selected from a group consisting of styrene, perchloroethylene, trichloroethylene, acetone, ethylene glycol ether, and trietha nolamine. The third solvent includes a third additive, and the third additive is selected from a group consisting of potassium hydroxide, sodium hydroxide, sodium tertiary butanol (NaO$_t$-Bu) and sodium bicarbonate.

In one embodiment, 5 millimoles of the 1, 4-dibromophenodiphene is added to a 100 mL two-necked flask, 5 milliliters of the organic thermal activation delayed fluorescent material and 25 milliliters of the potassium hydroxide are added, 40 mL acetone are added in an argon atmosphere, the abovementioned are reacted at room temperature for 24 hours, separated and purified to obtain the third intermediate product

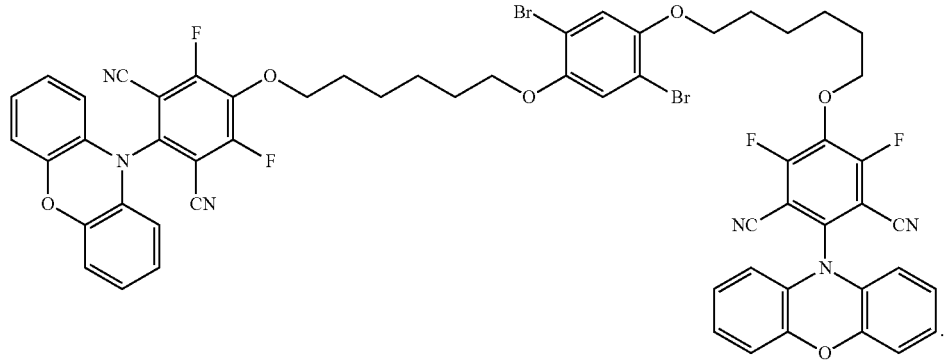 [SMILES: N#Cc1c(F)c(OCCCCCCOc2cc(Br)c(OCCCCCCOc3c(F)c(C#N)c(N4c5ccccc5Oc5ccccc54)c(C#N)c3F)cc2Br)c(F)c(C#N)c1N1c2ccccc2Oc2ccccc21]

D. the first intermediate product, the second intermediate product and the third intermediate product are reacted to generate the electroluminescent material.

A molecular structural formula of the electroluminescent material is as follows:

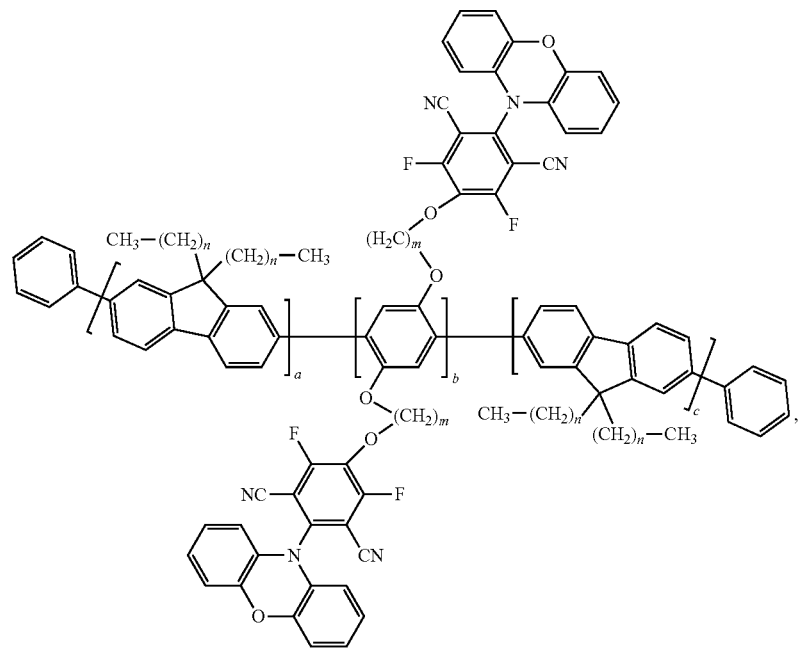

wherein m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

A reaction formula of the first intermediate product, the second intermediate product and the third intermediate product to generate the electroluminescent material is:

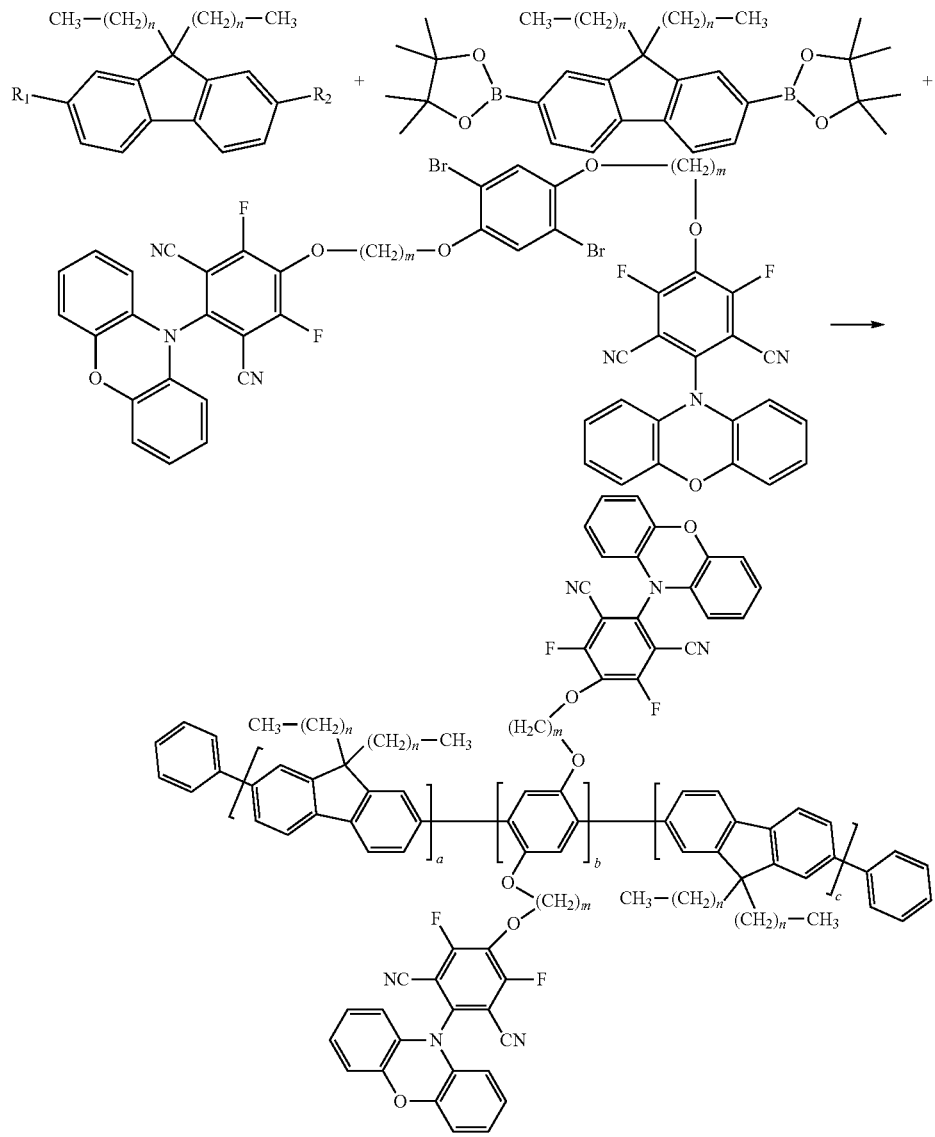

In one embodiment, in the reacting process of reacting the first intermediate product, the second intermediate product and the third intermediate product to generate the electroluminescent material, the relationship among a molar weight of the first intermediate product, a molar weight of the second intermediate product and a molar weight of the third intermediate product is that for 1 millimoles of the first intermediate product, there are 0.5 millimoles to 1.5 millimoles of the second intermediate product and 0.1 millimoles to 1.5 millimoles of the third intermediate product. In other embodiment, the relationship among the first intermediate product, the second intermediate product and the third intermediate product is 1 millimoles of the first intermediate product corresponding to 1.2 millimoles of the second intermediate product and 0.8 millimoles of the third intermediate product, 0.2 millimoles of the first intermediate product corresponding to 0.2 millimoles of the second intermediate product and 0.2 millimoles of the third intermediate product, or 0.5 millimoles of the first intermediate product corresponding to 0.6 millimoles of the second intermediate product and 0.5 millimoles of the third intermediate product.

In one embodiment, the first intermediate product, the second intermediate product and the third intermediate product are reacted in a fourth solvent to generate the electroluminescent material, and the fourth solvent is selected from a group consisting of styrene, trichloroethylene, toluene, N, N-dimethylformamide acetone, ethylene glycol ether, and triethanolamine. The fourth solvent includes a fourth additive, and the fourth additive is selected from a group consisting of [1,1'-bis (diphenyl phosphine) diferrocene] palladium dichloride (Pd(dppf)Cl$_2$), potassium acetate (KOAc), sodium tert-butyl alcohol (NaO$_t$-Bu), sodium acetate (NaOAc), palladium acetate (Pd(C$_2$H$_3$O$_2$)$_2$), and tri-butyl phosphtetrafluoroborate In one embodiment, 0.8 millimoles of the first intermediate

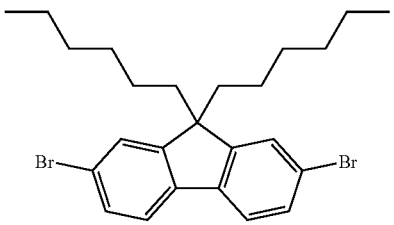 [SMILES: CCCCCCC1(CCCCCC)c2cc(Br)ccc2-c2ccc(Br)cc21]

is added to a 200 milliliters two-necked flask, 1.2 millimoles of the second intermediate

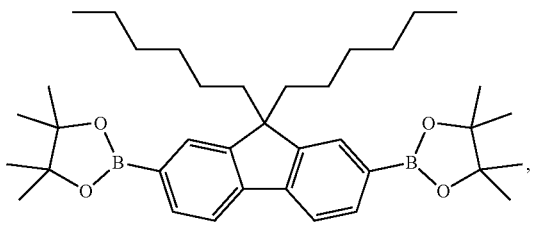

0.3 millimoles of the third intermediate

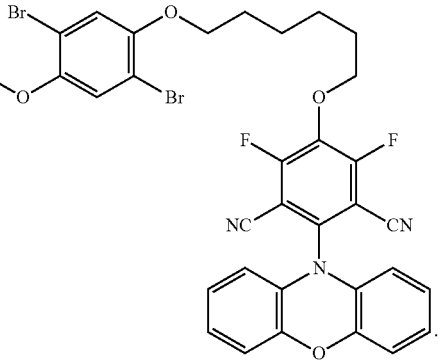

0.4 millimoles of the palladium acetate, 5 millimoles of the tri-tert-butylphosphine tetrafluoroborate, and 8 millimoles of the sodium tert-butoxide (NaOt-Bu) are added, 40 milliliters of toluene are added, it is reacted at 120 degrees centigrade for 24 hours, separates and purified to obtain the electroluminescent material

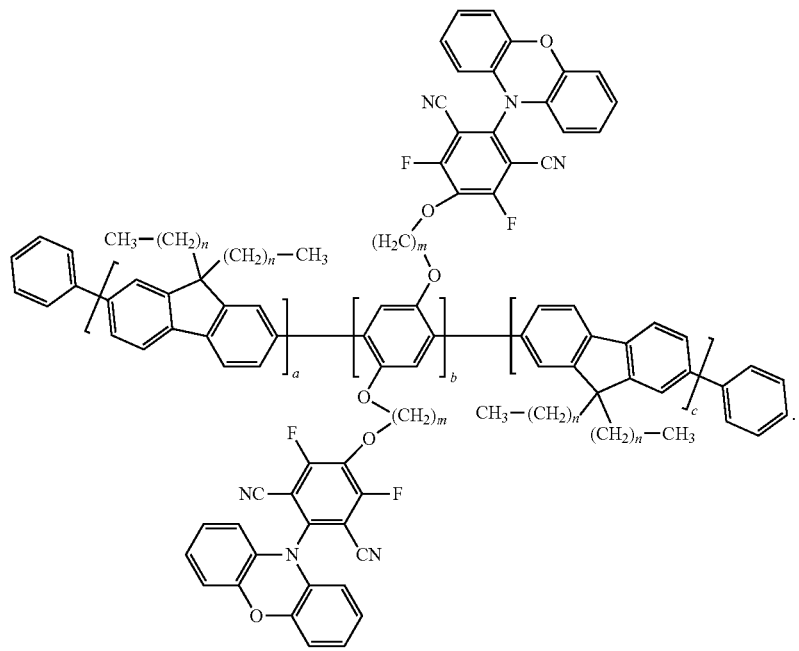

In the separating and purifying process, the reaction solution is cooled down to a room temperature, then the reaction solution is poured into ice water and extracted twice to five times by an extraction solvent to obtain the organic phase, the organic phase are spinned into silica gel, and the silica gel are employed column chromatography by a chromatographic column to obtain a white powder also defined as the electroluminescent material. The yield of the electroluminescent material is greater than or equal to 55%.

The extraction solvent is selected from a group consisting of dichloromethane, trichloromethane, and tetrahydrofuran. A volume ratio of dichloromethane and n-hexane of the chromatographic column ranges from 1:0.5 to 1:10.

A number average molecular weight of the electroluminescent material ranges from 10 kg/mol to 15 kg/mol. A weight average molecular weight of the electroluminescent material ranges from 15 g/mol to 20 g/mol. A fraction of the electroluminescent material ranges from 1.3 to 2.5.

Referring to Table 1, table 1 is the peak value of the fluorescence spectrum of the electroluminescent material and the energy level values of the energy states of the electroluminescent material.

TABLE 1

|  | PL Peak (nm) | $S_1$ (eV) | $T_1$ (eV) | $\Delta E_{ST}$ (eV) | HOMO (eV) | LUMO (eV) |
| --- | --- | --- | --- | --- | --- | --- |
| main chain | 405 | 3.06 | 2.97 | 0.09 | −5.35 | −2.13 |
| TADF side chain | 413 | 3.00 | 2.93 | 0.07 | −5.45 | −2.14 |

Wherein, PL Peak is defined as a peak value of the fluorescence spectrum of the electroluminescent material, S1 is a number of the lowest singlet energy level, T1 is a number of the lowest triplet energy level, $\Delta E_{ST}$=S1−T1, HOMO is a number of an energy level of the highest electron occupied orbit, LUMO is a number of an energy level of the lowest electron unoccupied orbit.

Referring to FIG. 1, FIG. 1 is a photoluminescence spectrum of an electroluminescent material been in toluene of the present application. A first peak of the electroluminescent material is between 440 nm and 470 nm. A wavelength of the first peak corresponds to a wavelength of a blue light. A second peak of the electroluminescent material is between 540 nm and 580 nm. A wavelength of the second peak corresponds to a wavelength of a yellow light. Therefore, the electroluminescent material provided in the present application is excited, emitting blue light and yellow light emitted from the electroluminescent material of the present application are mixed to a white light.

Figure 2:
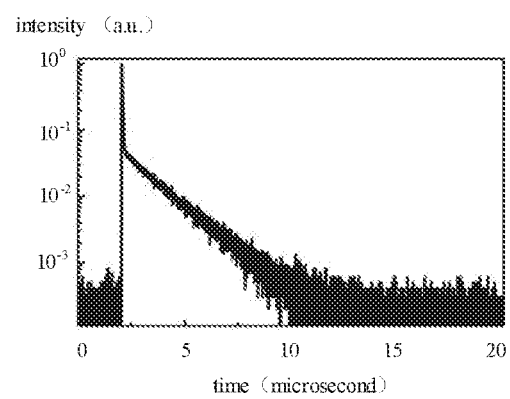
FIG. 2 is a transient photoluminescence spectrum of the electroluminescent material been in toluene of one exemplary embodiment of the present application.

Referring to FIG. 2, FIG. 2 is a transient photoluminescence spectrum of the electroluminescent material been in toluene of the present application.

Figure 3:
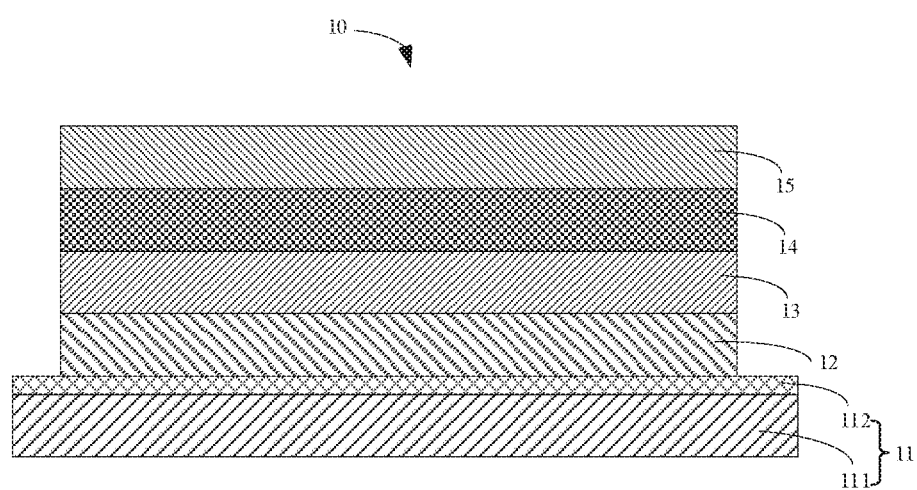
FIG. 3 is a structural view of a luminescent device of one exemplary embodiment of the present application.

Referring to FIG. 3, FIG. 3 is a schematic structural view of a light emitting device of the present application.

A luminescent device 10 is provided. The luminescent device 10 includes a base layer 11, a cavity transmitting and injecting layer 12, a luminescent layer 13, an electronic transmitting layer 14 and a second electrode layer 15.

The base layer 11 includes a substrate base 111 and a first electrode layer 112 formed on the substrate base 111. The cavity transmitting and injecting layer 12 is formed on the base layer 10. The cavity transmitting and injecting layer 12 is electrically connected to the first electrode layer 112. The electronic transmitting layer 14 is formed on the luminescent layer 13. The second electrode layer 15 is electrically connected to the electronic transmitting layer 14.

The substrate base 111 is made of a glass substrate. The first electrode layer 112 is made of indium tin oxide. The cavity transmitting and injecting layer 112 is made of 3,4-ethylenedioxythiophene: polystyrene sulfonates (PEDOT:PSS). The electronic transmitting layer 14 is made of 1,3, 5-tri(3-(3-pyridine) phenyl) benzene (Tm3PyPB). The second electrode layer 15 is made of lithium fluoride/aluminum (LiF/Al). The luminescent layer 13 includes the electroluminescent material, a molecular structural formula of the electroluminescent material is as follows:

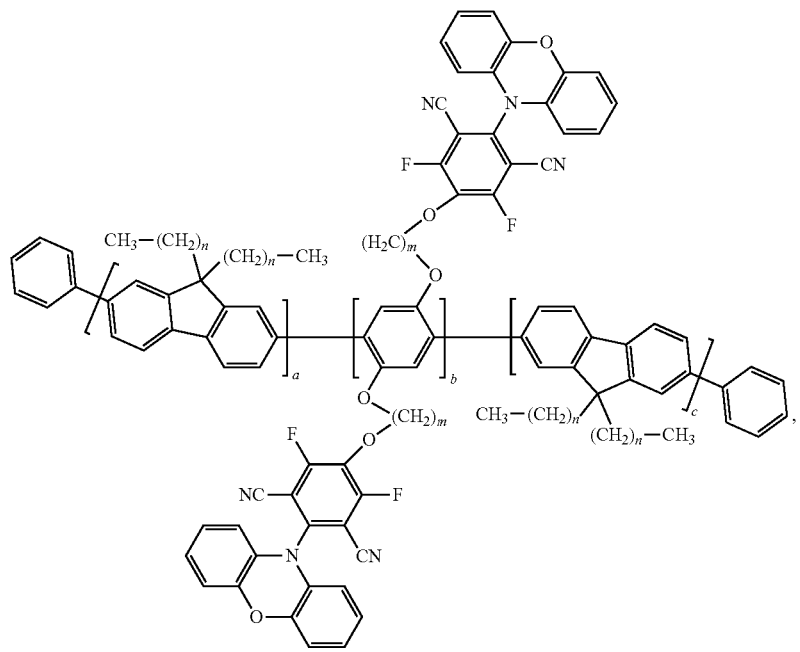

wherein m is a number greater than or equal to 4, and n is a number greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

Referring to Table 2, table 2 is a performance data of the luminescent device of the present application.

TABLE 2

| | maximum brightness (cd/m$^2$) | maximum current efficiency (cd/A) | chromaticity coordinates CIE | maximum external quantum efficiency (%) |
|---|---|---|---|---|
| luminescent device | 3465 | 39.7 | (0.26, 0.35) | 15.3 |

An electroluminescent material and a method for manufacturing the electroluminescent material, and a luminescent device are provided and includes: reacting the first reactant

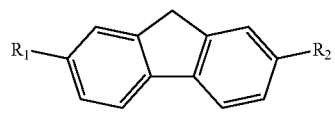

and the second reactant $CH_3$—$(CH_2)_n$—$R_3$ to generate the intermediate product

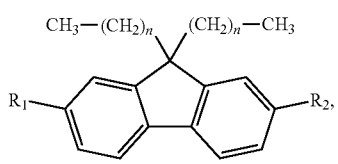

reacting the first intermediate product and the third reactant

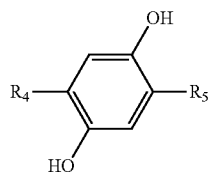

to generate the second intermediate product

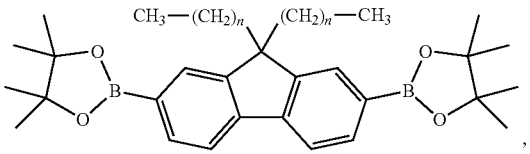

reacting the fourth reactant

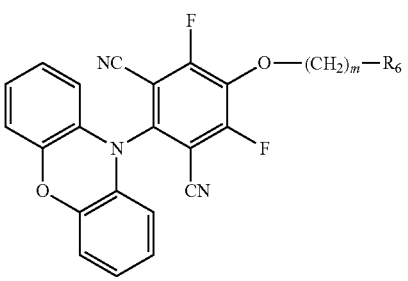

and the fifth reactant

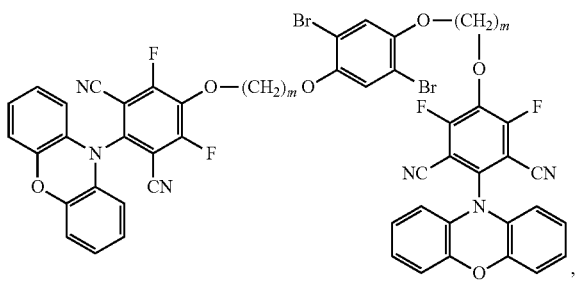

to generate the third intermediate product and reacting the first intermediate product, the second intermediate product and the third intermediate product to generate the electroluminescent material

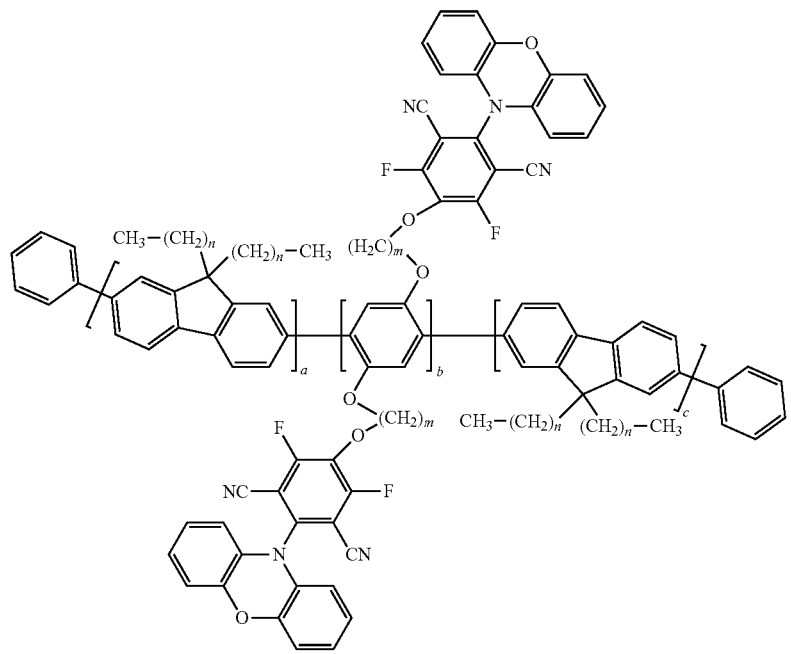

to realize a high quantum efficiency of a white light electroluminescent material and device.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. An electroluminescent material, wherein a molecular structural formula of the electroluminescent material is as follows:

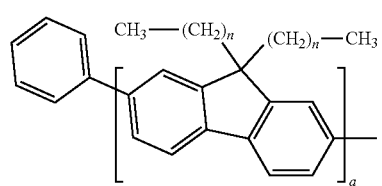

-continued

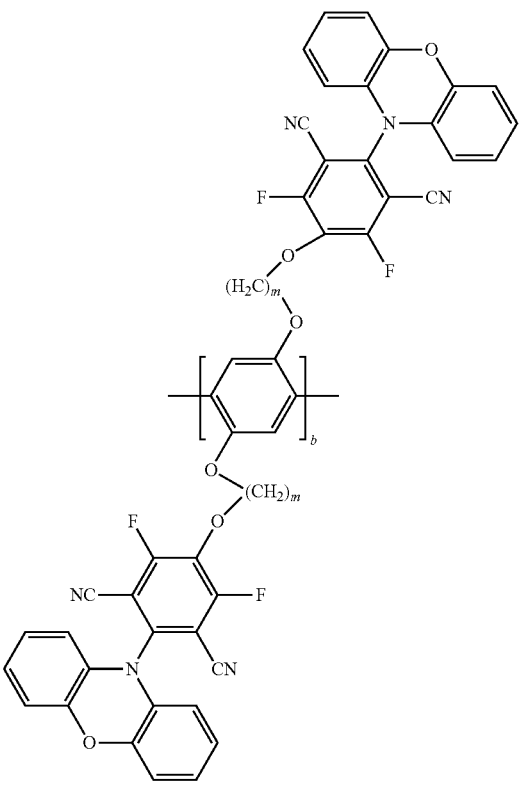

-continued

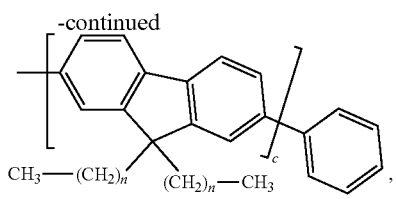

wherein m is an integer greater than or equal to 4, and n is an integer greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

2. A method for manufacturing an electroluminescent material, comprising:
providing a first reactant and a second reactant and reacting the first reactant and the second reactant to generate a first intermediate product, wherein a molecular

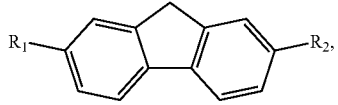

structural formula of the first reactant is a molecular structural formula of the second reactant is $CH_3\sim(CH_2)_n\sim R_3$, a molecular structural formula of the

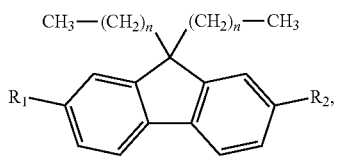

first intermediate product is wherin n is an integer greater than or equal to 3, $R_1$ is Cl, Br, or I, $R_2$ is Cl, Br, or I, and $R_3$ is Cl, Br, or I;
providing a third reactant and reacting the first intermediate product and the third reactant to generate a second intermediate product, wherein the third reactant is a a bis(pinacolato)diboron reagent, a molecular structural formula of the third reactant is

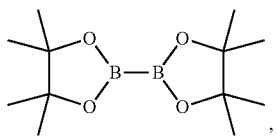

a molecular structural formula of the second intermediate product

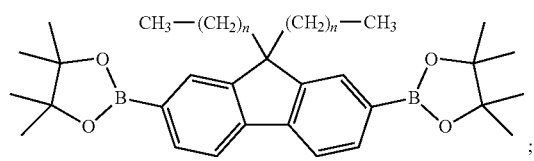

is
providing a fourth reactant and a fifth reactant and reacting the fourth reactant and the fifth reactant to generate a third intermediate product, wherein a molecular

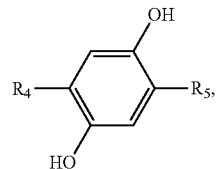

structural formula of the fourth reactant is a molecular structural

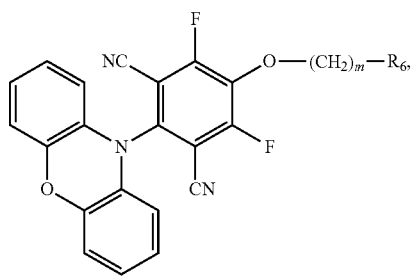

formula of the fifth reactant is a molecular structural formula of the third intermediate product is

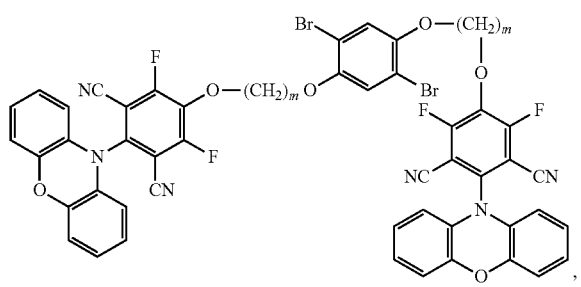

wherein m is an integer greater than or equal to 4, $R_4$ is Cl, Br, or I, $R_5$ is Cl, Br, or I, and $R_6$ is Cl, Br, or I;
reacting the first intermediate product, the second intermediate product and the third intermediate product to generate the electroluminescent material.

3. The method for manufacturing the electroluminescent material of claim 2, wherein in the reacting process of reacting the first reactant and the second reactant to generate the first intermediate product, a relationship between a molar weight of the first reactant and a volume of the second reactant is that for 1 millimoles of the first reactant, there are 0.5 milliliters-2 milliliters of the second reactant.

4. The method for manufacturing the electroluminescent material of claim 3, wherein the first reactant and the second reactant are reacted in a first solvent to generate the first intermediate product, and the first solvent is selected from a group consisting of styrene, perchloroethylene, trichloroethylene, acetone, ethylene glycol ether, and triethanolamine.

5. The method for manufacturing the electroluminescent material of claim 4, wherein the first solvent comprises a first additive, and the first additive is selected from a group consisting of potassium hydroxide, sodium hydroxide, sodium tertiary butanol (NaO$_t$-Bu), and sodium bicarbonate.

6. The method for manufacturing the electroluminescent material of claim 2, wherein in the reacting process of reacting the first intermediate product and the third reactant to generate the second intermediate product, a relationship between a molar weight of the first intermediate product and a molar weight of the third reactant is that for 1 millimoles of the first intermediate product, there are 1 millimoles-5 millimoles of the third reactant.

7. The method for manufacturing the electroluminescent material of claim 6, wherein the first intermediate product and the third reactant are reacted in a second solvent to generate the second intermediate product, and the second solvent is selected from a group consisting of styrene, perchloroethylene, trichloroethylene, acetone, sodium tert-butanol (NaO$_t$-Bu), N, n-dimethylformamide, and triethanolamine.

8. The method for manufacturing the electroluminescent material of claim 7, wherein the second solvent comprises a second additive, and the second additive is selected from a group consisting of [1,1'-bis (diphenyl phosphine) diferrocene] palladium dichloride (Pd(dppf)Cl$_2$), potassium acetate (KOAc), sodium acetate (NaOAc), sodium tert-butanol (NaO$_t$-Bu), potassium nitrate (KNO$_3$), and magnesium sulfate (MgSO$_4$).

9. The method for manufacturing the electroluminescent material of claim 2, wherein in the reacting process of reacting the fourth reactant and the fifth reactant to generate the third intermediate product, a relationship between a molar weight of the fourth reactant and a molar weight of the fifth reactant is that for 1 millimoles of the fourth reactant, there are 1 millimoles-10 millimoles of the fifth reactant.

10. The method for manufacturing the electroluminescent material of claim 9, wherein the fourth reactant and the fifth reactant are reacted in a third solvent to generate the third intermediate product, and the third solvent is selected from a group consisting of styrene, perchloroethylene, trichloroethylene, acetone, ethylene glycol ether, and triethanolamine.

11. The method for manufacturing the electroluminescent material of claim 10, wherein the third solvent comprises a third additive, and the third additive is selected from a group consisting of potassium hydroxide, sodium hydroxide, sodium tertiary butanol (NaO$_t$-Bu) and sodium bicarbonate.

12. The method for manufacturing the electroluminescent material of claim 2, wherein in the reacting process of reacting the first intermediate product, the second intermediate product and the third intermediate product to generate the electroluminescent material, a relationship among a molar weight of the first intermediate product, a molar weight of the second intermediate product and a molar weight of the third intermediate product is that for 1 millimoles of the first intermediate product, there are 0.5 millimoles-1.5 millimoles of the second intermediate product and 0.1 millimoles-1.5 millimoles of the third intermediate product.

13. The method for manufacturing the electroluminescent material of claim 12, wherein the first intermediate product, the second intermediate product and the third intermediate product are reacted in a fourth solvent to generate the electroluminescent material, and the fourth solvent is selected from a group consisting of styrene, trichloroethylene, toluene, N, n-dimethylformamide acetone, ethylene glycol ether, and triethanolamine.

14. The method for manufacturing the electroluminescent material of claim 13, wherein the fourth solvent comprises a fourth additive, and the fourth additive is selected from a group consisting of [1,1'-bis (diphenyl phosphine) diferrocene] palladium dichloride (Pd(dppf)Cl$_2$), potassium acetate (KOAc), sodium tert-butyl alcohol (NaO$_t$-Bu), sodium acetate (NaOAc), palladium acetate (Pd(C$_2$H$_3$O$_2$)$_2$), and tri-butyl phosphtetrafluoroborate.

15. The method for manufacturing the electroluminescent material of claim 2, wherein a molecular structural formula of the electroluminescent material is as follows:

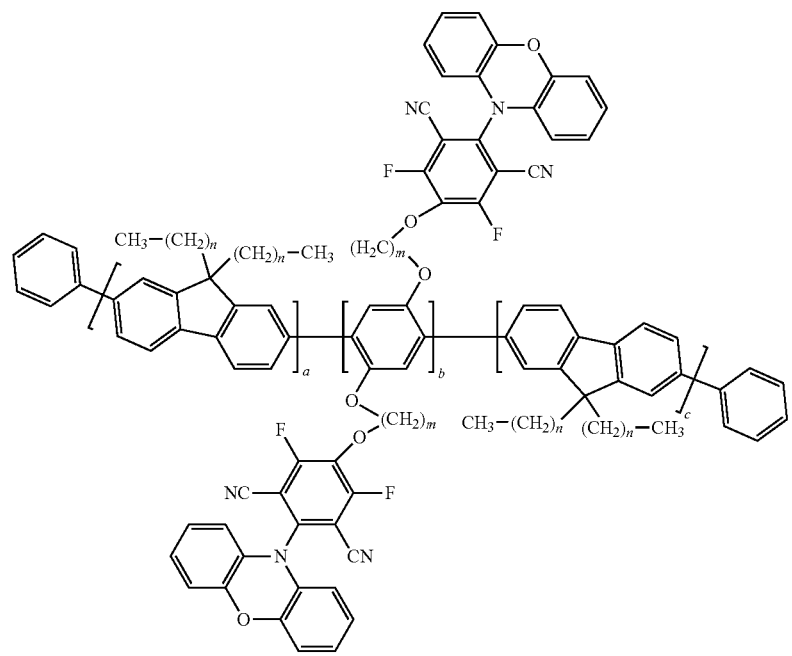

wherein m is an integer greater than or equal to 4, and n is an integer greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

16. The method for manufacturing the electroluminescent material of claim 2, wherein the reacting process of reacting the first intermediate product, the second intermediate product and the third intermediate product to generate the electroluminescent material comprises:
reacting the first intermediate product, the second intermediate product and the third intermediate product to produc a mixture containing the electroluminescent material;
separating and purifying the mixture containing the electroluminescent material to obtain the electroluminescent material.

17. The method for manufacturing the electroluminescent material of claim 16, wherein the reacting process of separating and purifying the mixture containing the electroluminescent material to obtain the electroluminescent material comprises:
extracting the mixture containing the electroluminescent material by an extraction solvent; and
employing column chromatography to the mixture containing the electroluminescent material by a chromatographic column.

18. The method for manufacturing the electroluminescent material of claim 17, wherein the extraction solvent is selected from a group consisting of dichloromethane, trichloromethane, and tetrahydrofuran.

19. The method for manufacturing the electroluminescent material of claim 17, wherein a volume ratio of dichloromethane and n-hexane of the chromatographic column ranges from 1:0.5 to 1:10.

20. A luminescent device, wherein comprises:
a base layer, the base layer comprises a substrate base and a first electrode layer formed on the substrate base;
a cavity transmitting and injecting layer, the cavity transmitting and injecting layer is formed on the base layer, and electrically connected to the first electrode layer;
a luminescent layer, the luminescent layer is formed on the cavity transmitting and injecting layer;
an electronic transmitting layer, the electronic transmitting layer is formed on the luminescent layer; and
a second electrode layer, the second electrode layer is electrically connected to the electronic transmitting layer, wherein the luminescent layer comprises a electroluminescent material, a molecular structural formula of the electroluminescent material is as follows:

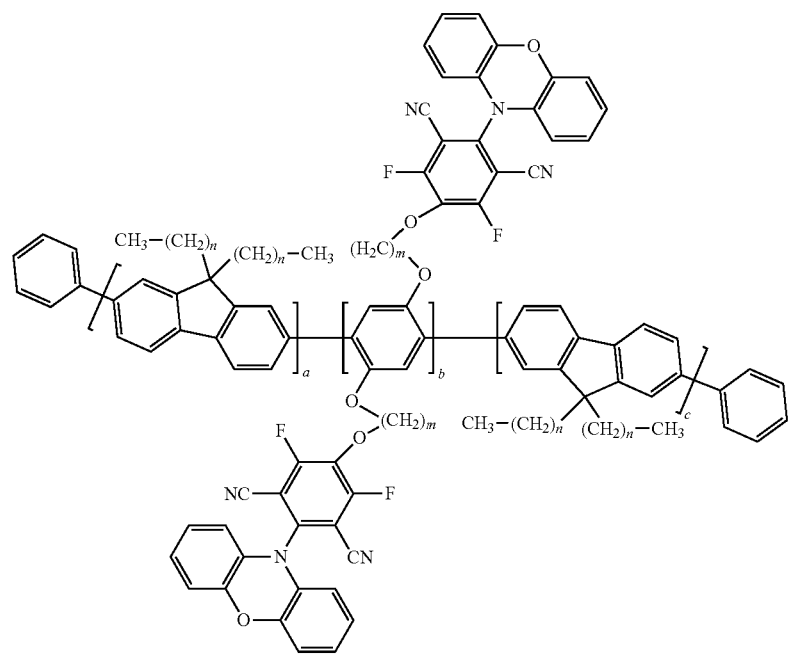

wherein m is an integer greater than or equal to 4, and n is an integer greater than or equal to 3, a, b and c are natural numbers, a/(a+b+c) equals to a number ranging from 0.2 to 0.8, b/(a+b+c) equals to a number ranging from 0.1 to 0.4, and c/(a+b+c) equals to a number ranging from 0.1 to 0.4.

* * * * *